United States Patent [19]

Lerude et al.

[11] Patent Number: 4,575,785
[45] Date of Patent: Mar. 11, 1986

[54] VISUAL INDICATOR SUPPORT ON A PRINTED CIRCUIT

[75] Inventors: Gérard Lerude, Antibes; Christine Roux, Le Rouret, both of France

[73] Assignee: La Telemecanique Electrique, France

[21] Appl. No.: 636,636

[22] Filed: Aug. 1, 1984

[30] Foreign Application Priority Data

Aug. 1, 1983 [FR] France .............................. 83 12627

[51] Int. Cl.$^4$ ............................................. F21V 17/04
[52] U.S. Cl. .................................. 362/226; 362/438; 362/353; 362/800
[58] Field of Search ............... 362/226, 227, 249, 370, 362/437, 438, 353, 800, 362, 383

[56] References Cited

U.S. PATENT DOCUMENTS

| | | | |
|---|---|---|---|
| 4,195,330 | 3/1980 | Savage | 362/226 |
| 4,318,158 | 3/1982 | Livermore et al. | 362/226 |
| 4,398,240 | 8/1983 | Savage | 362/226 |
| 4,419,722 | 12/1983 | Bury | 362/800 |
| 4,471,414 | 9/1984 | Savage | 362/226 |
| 4,507,718 | 3/1985 | Bury | 362/800 |

Primary Examiner—Magdalen Y. C. Moy
Assistant Examiner—David A. Okonsky
Attorney, Agent, or Firm—William A. Drucker

[57] ABSTRACT

A visual indicator lamp support is provided comprising an elongate insulating body having a front face and a rear face substantially perpendicular to its longitudinal dimension and forming, at its front face, jaws for insertion of the indicator lamp, a bearing surface inside said body cooperating with the rear face of the indicator lamp, holes through which the wires thereof extend formed through said body and means for securing to a printed circuit card, wherein said body forms a reference surface perpendicular to said rear face and joined thereto by a re-entrant surface adapted for freeing a portion of said wires and shaped so that bending back of said body from a first position in which its rear face is in abutment against the card and plays the role of spacer defining a pre-determined distance between said rear face of the indicator lamp and the surface of the printed circuit for soldering said wires to a second position in which said reference surface is in abutment against the card, results in causing pre-determined bending of said wires.

10 Claims, 5 Drawing Figures

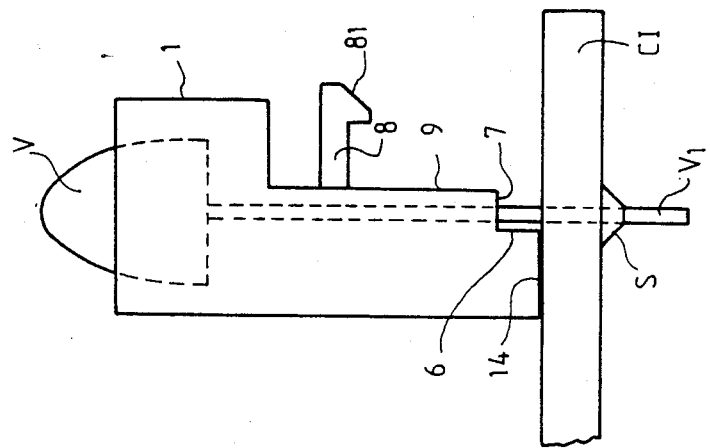

4,575,785

VISUAL INDICATOR SUPPORT ON A PRINTED CIRCUIT

BACKGROUND OF THE INVENTION

The invention relates to devices for supporting a visual indicator lamp, such as a light-emitting diode and for positioning it and securing it to a printed circuit card.

Among known devices, some provide efficient and stable positioning and securing but require relatively complicated and expensive operations for mounting the indicator lamps; others are simpler to put into practice but do not provide very accurate positioning, this latter quality being incompatible with the fact that, during mounting, certain clearances must be tolerated if a high production rate is desired. In all these devices, the connecting wires must be bent over an appropriate mount before insertion thereof in the holes of the printed circuit.

The invention proposes overcoming one or more of the disadvantages of known supports and providing a simple device in which the predetermined bending operation, more particularly of the wires, is not required.

SUMMARY OF THE INVENTION

In accordance with the invention, this result is obtained by means of a visual indicator lamp support comprising an elongate insulating body having a front face and a rear face substantially perpendicular to its longitudial dimension and forming, at its front face, jaws for insertion of the indicator lamp, a bearing surface inside said body cooperating with said rear surface of the indicator lamp, holes for passing the wires of this latter through formed in said body and means for securing to a printed circuit card, said body of said support forming a reference surface perpendicular to the rear face and connected thereto by a re-entrant surface adapted so as to free a portion of said wires and shaped so that bending back of said body from a first position in which its rear face bears on the card and plays the role of spacer defining a predetermined distance between the rear face of the indicator lamp and the surface of the printed circuit for soldering the wires thereof, to a second position in which said predetermined reference surface is in abutment against said card, results in causing bending of said wires.

In a preferred embodiment, said securing means comprise a hook adapted for clip-on cooperation with the edge of the printed circuit adjacent the passage holes for the wires, when the body is in the bent-back position. According to another feature, said re-entrant surface is shaped so as to serve as bending jig for the wires, so that, after clip-on, a residual resilient stress continues to be exerted on said wires.

BRIEF DESCRIPTION OF THE DRAWINGS

Other features, as well as the advantages of the invention will be clear from the following description. In the accompanying drawings:

FIG. 3 is a profile view of the device, in a first phase of mounting same on a printed circuit;

FIG. 4 shows the device in the final mounting phase;

The same reference numbers designate the same elements in the different figures.

DESCRIPTION OF THE PREFERRED EMBODIMENT

Figure 1:
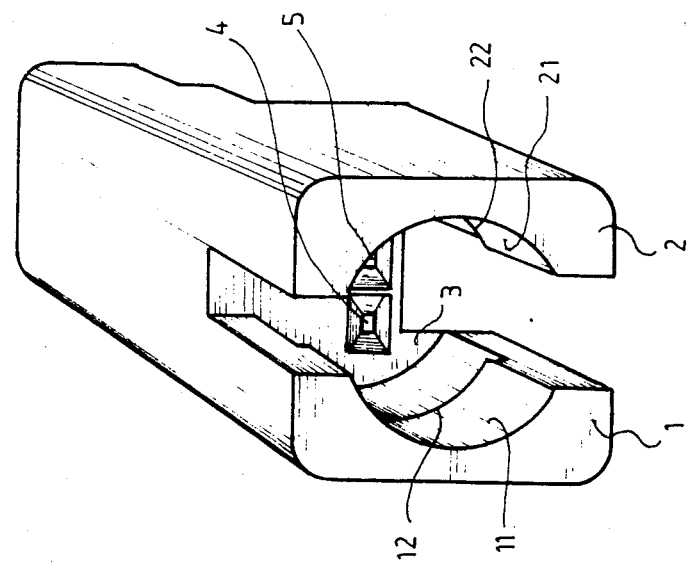
FIG. 1 is a view of the front of a device according to a preferred embodiment of the invention.

In FIG. 1 it can be seen that the housing for the indicator lamp (not shown) is defined by two flexible jaws 1,2 and a bearing surface 3 having two chamfered holes 4,5 facilitating the introduction of the wires of the indicator lamp. The jaws 1,2 comprise, on their internal face, chamfers 11 and 21 defined towards the bottom by edges 12 and 22 which brake the indicator lamp so as to prevent it from coming out during the intermediate mounting phases.

Figure 2:
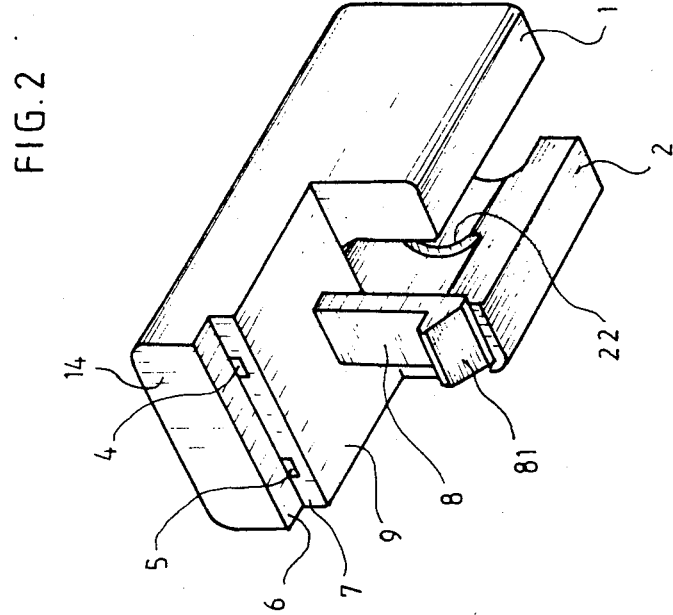
FIG. 2 is a view of the rear of the device.

In FIG. 2, it can be seen that the passages 4,5 for the wires open into a re-entrant surface 6,7 shaped, in the non limitative example described, as a step whose height 6 is greater than the width 7. A surface 9, perpendicular to the front 1,2 and rear 14 faces serves as a surface bearing on the printed circuit on which the indicator lamp is mounted and a hook 8 having a chamfer 81 for facilitating clipping thereof on to the edge of the printed circuit, is disposed perpendicularly to the surface 9. After inserting an indicator lamp V having a cylindrical body or a body in the shape of an ogive between jaws 1,2 wires V1, V2 are inserted into the connecting holes of a printed circuit CI. The body of the device serves as a spacer for limiting the penetration of the wires to the desired length by bearing on the printed circuit with its rear face 14. Then the wires are connected electrically and mechanically to the printed circuit by soldered joints S. These soldered joints may be formed by wave soldering as for simple resistors.

After the wires are soldered, the assembly formed by the indicator lamp and its support is bent back towards the edge of the printed circuit, which bends the wires at the bending zone V10 and, at the end of the movement, the hook 8, because of its chamfer 21, clips on to the edge of the circuit CI and thus applies face 9 of the support against the surface of the printed circuit. The height 6 of the step defines the length of the bending zone V10 of the wires and the distance which separates their outlet from face 9 along face 7 defines their bending radius. The step thus serves as jig for bending the wires, which jig will be advantageously determined so as to leave a certain resilient stress on the wires after clipping. The clipping-on of hook 8 on the edge of the printed circuit then exerts a bending stress in zone V10 of the wires, the resilience of which produces a return force which applies the hook against the edge of the printed circuit.

The final position of the device is defined without residual play. In fact, the reference surface 9, after clip-on, is applied against the printed circuit and the relatively wide hook 8 is applied against the edge of said printed circuit by the resilience of the zone V10 of the wires, which guarantees the correct orientation of the support and of the indicator lamp which is fixed thereto.

The device which has just been described, formed from a single insulating part, cumulates the following functions:

mechanical protection of the indicator lamp;
spacer for positioning the indicator lamp, unbent wires, for wave-soldering the assembly formed by the support and the indicator lamp like a simple resistor;

bending jig for the wires after soldering;

indicator lamp support clipping on to the edge of the printed circuit after bending, while removing any play;

efficient mechanical maintenance of the position and orientation of the indicator lamp.

Figure 5:
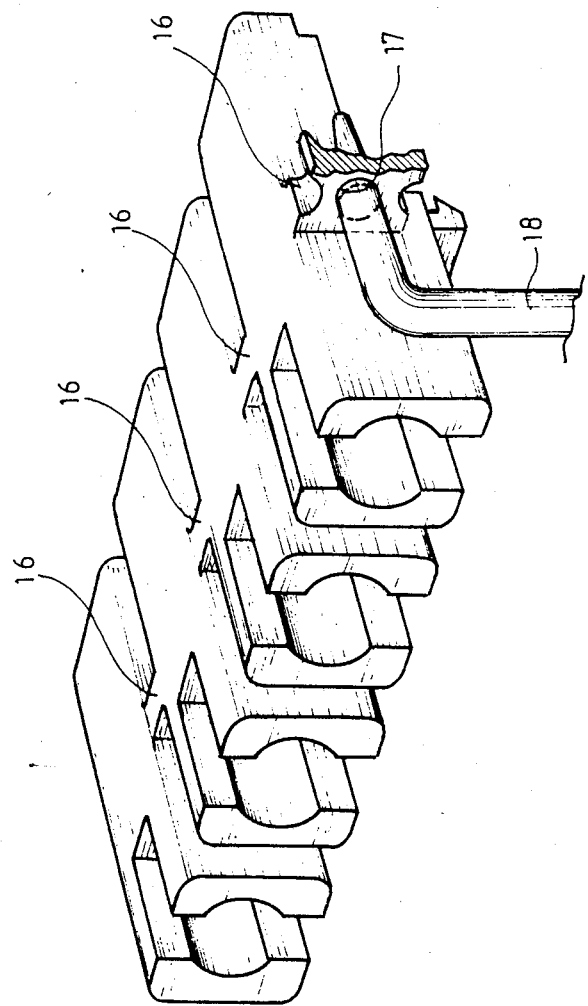
FIG. 5 shows a strip of several identical detachable devices.

As shown in FIG. 5, the device may be formed as a strip of several identical elements connected together by weakened and detachable portions 16 which may be used individually or in strips supporting several indicator lamps at predetermined intervals.

For facilitating fitting of the wires of the different indicator lamps to be mounted on the same support strip, it is advantageous to insert an indicator lamp first of all at each end of the strip, then to fit the corresponding wires into the desired holes of the printed circuit, which aligns the strip to the circuit and to fit each of the other indicator lamps simultaneously through the strip and the printed circuit. This wire-guide function, at the time of insertion, may save a great deal of time with respect to the mounting of a known device of the "plastron" kind supporting indicator lamps whose wires are pre-bent.

The above-described operating mode is applicable to machines for the automatic insertion of indicator lamps, for example using two unoccupied positions for placing flexible centering studs.

Another solution, shown in FIG. 5, consists in positioning the support strip by means of a specific tool 18 having two points penetrating into two holes 17 formed in two weakened portions 16 of the strip, so as to maintain it on the circuit during automatic insertion of the indicator lamps through holes 4 and 5 and corresponding holes in the printed circuit.

Different modifications may of course be made to the device described and shown without departing from the scope and spirit of the invention.

What is claimed is:

1. In a visual indicator lamp support comprising an elongate insulating body having a front face and a rear face substantially perpendicular to its longitudinal dimension and forming, at its front face, jaws for insertion of an indicator lamp, said indicator lamp having lead wires, a bearing surface inside said body cooperating with a rear surface of the indicator lamp, passage holes for the lead wires thereof formed through said body and means for securing the lead wires to a printed circuit card, said body having a reference surface perpendicular to the rear face and having a re-entrant surface with said passage holes therein and joining said reference surface and rear face to thereby form a channel, said channel frees a portion of said wires for bending, said body being rotatable from a first position in which its rear face is in abutment against the card while said leads are secured to a second position in which said reference surface is in abutment against the card, said rotation causing a pre-determined bending of said wires.

2. The visual indicator lamp support as claimed in claim 1, wherein said jaws from a housing for a cylindrical or oqival shaped body of said indicator lamp, adapted so that the axis of symmetry thereof is held in a direction substantially parallel to said longitudinal dimension.

3. The visual indicator lamp support as claimed in claim 2, wherein the internal surfaces of said jaws, which define said housing, form chambers limited rearwardly by edges adapted for braking removal of the body of the indicator lamp.

4. A support assembly comprising a plurality of visual indicator lamp supports such as claimed in claim 1, which are identical and whose bodies are joined together by weakened portions allowing separation of the plurality of supports.

5. The assembly as claimed in claim 4, wherein said weakened portions are provided with holes for introducing therein tools for centering the assembly with respect to a printed circuit.

6. The visual indicator lamp support as claimed in claim 1, wherein said securing means comprise a hook adapted for cooperating, by clipping-on, with an edge of the printed circuit card adjacent the passage holes for the wires, when said body is in a bent-back position.

7. The visual indicator lamp support as claimed in claim 6, wherein said hook is integral with said reference surface and comprises a chamfer at its clip-on end.

8. The visual indicator lamp support as claimed in claim 6, wherein said re-entrant surface is shaped so as to serve as a bending jig for said wires, so that after clipping-on a resilient stress continues to be exerted on said wires.

9. The visual indicator lamp support as claimed in claim 8, wherein said re-entrant surface has the form of a step in height whose width is parallel to said rear face.

10. A visual indicator lamp support as claimed in claim 9, wherein said holes for passing the wires through open rearwardly of said body at the level of said bearing surface and are extended rearwardly by grooves opening at the level of the width of said step.

* * * * *